(12) United States Patent
Schlarmann et al.

(10) Patent No.: US 8,304,275 B2
(45) Date of Patent: Nov. 6, 2012

(54) MEMS DEVICE ASSEMBLY AND METHOD OF PACKAGING SAME

(75) Inventors: Mark E. Schlarmann, Chandler, AZ (US); Yizhen Lin, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 150 days.

(21) Appl. No.: 12/873,195

(22) Filed: Aug. 31, 2010

(65) Prior Publication Data
US 2012/0049298 A1 Mar. 1, 2012

(51) Int. Cl.
*H01L 29/96* (2006.01)
(52) U.S. Cl. ..... 438/52; 438/51; 257/415; 257/E29.324; 73/514.16
(58) Field of Classification Search ............ 257/415, 257/E29.324; 438/51, 52; 73/754, 514.16, 73/721, 727
See application file for complete search history.

(56) References Cited

U.S. PATENT DOCUMENTS

| 6,925,875 | B2* | 8/2005 | Silverbrook ............ 73/493 |
| 7,475,597 | B2 | 1/2009 | Brida et al. |
| 7,661,318 | B2 | 2/2010 | Brosh et al. |
| 8,072,081 | B2* | 12/2011 | Wang .................... 257/776 |
| 2008/0022777 | A1 | 1/2008 | Tan et al. |
| 2008/0236292 | A1* | 10/2008 | Reijs ..................... 73/727 |
| 2008/0290430 | A1 | 11/2008 | Mahadevan |
| 2008/0314723 | A1 | 12/2008 | Liu |
| 2010/0109103 | A1* | 5/2010 | Tsao ..................... 257/418 |
| 2011/0159627 | A1* | 6/2011 | Mantravadi et al. ......... 438/52 |

* cited by examiner

*Primary Examiner* — Matthew W Such
*Assistant Examiner* — Scott Stowe
(74) *Attorney, Agent, or Firm* — Meschkow & Gresham, P.L.C.

(57) ABSTRACT

A MEMS device assembly (20) includes a MEMS die (22) and an integrated circuit (IC) die (24). The MEMS die (22) includes a MEMS device (36) formed on a substrate (38) and a cap layer (34). A packaging process (72) entails forming the MEMS device (36) on the substrate (38) and removing a material portion of the substrate (38) surrounding the device (36) to form a cantilevered substrate platform (46) at which the MEMS device (36) resides. The cap layer (34) is coupled to the substrate (38) overlying the MEMS device (36). The MEMS die (22) is electrically interconnected with the IC die (24). Molding compound (32) is applied to substantially encapsulate the MEMS die (22), the IC die (24), and interconnects (30) that electrically interconnect the MEMS device (22) with the IC die (24). The cap layer (34) prevents the molding compound (32) from contacting the MEMS device (36).

11 Claims, 11 Drawing Sheets

US 8,304,275 B2

MEMS DEVICE ASSEMBLY AND METHOD OF PACKAGING SAME

TECHNICAL FIELD OF THE INVENTION

The present invention relates generally to microelectromechanical systems (MEMS) device assemblies. More specifically, the present invention relates to MEMS device assemblies and method of packaging for improved stress isolation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

There are significant challenges to be surmounted in the packaging of MEMS devices due at least in part to the necessity for the MEMS devices to interact with the outside environment, the fragility of many types of MEMS devices, and severe cost constraints. Indeed, many MEMS device applications require smaller size and low cost packaging to meet aggressive cost targets. The packaging of MEMS sensor applications often uses materials with dissimilar coefficients of thermal expansion. As such, a high thermally induced stress can develop during MEMS device manufacture or operation. These thermal stresses, as well as stresses due to moisture and assembly processes, can result in deformation of the underlying substrate, referred to herein as package stress. Variations in package stress can cause instability of the MEMS device and output shifts in the MEMS device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

As the uses for MEMS devices continue to grow and diversify, increasing emphasis is being placed on smaller size and low cost packaging without sacrificing part performance. Another continuing challenge in MEMS device packaging is providing environmental protection for the fragile moving parts of a MEMS device that does not affect the mechanical motion of these moving parts. Embodiments entail microelectromechanical systems (MEMS) device assemblies and a method of packaging such MEMS device assemblies for improved stress isolation. In particular, MEMS devices are created through the execution of relatively simple methodology as cantilevered structures that provide improved package stress isolation. The methodology additionally allows for the use of low-cost overmolded packaging that provides the appropriate environmental protection of the MEMS devices without affecting the mechanical motion of the moving parts of the MEMS devices.

Figure 1:
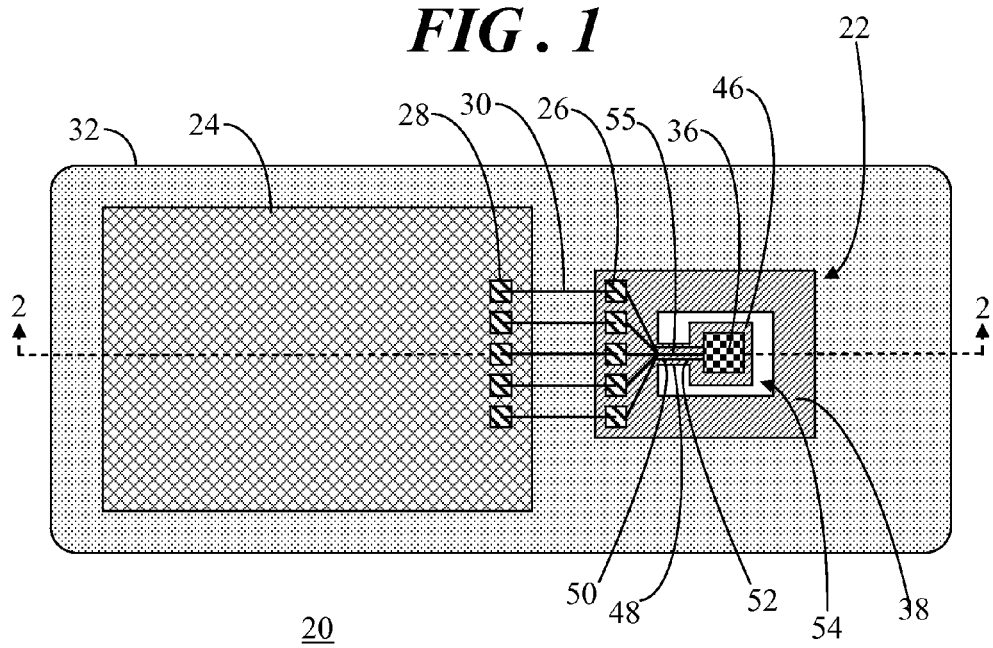
FIG. 1 shows a top view of a microelectromechanical systems (MEMS) chip in accordance with an embodiment.
Figure 2:
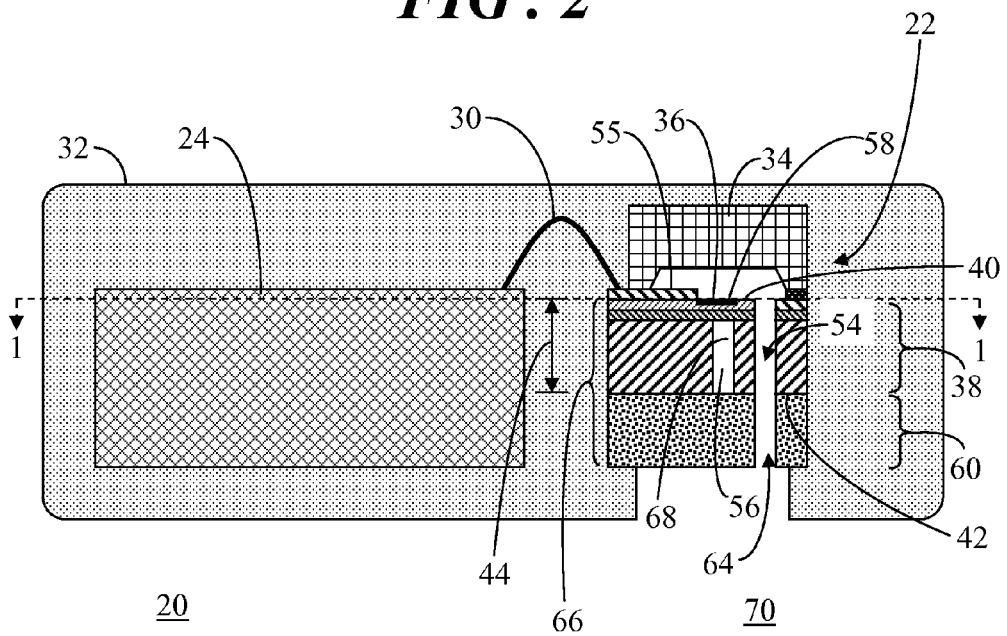
FIG. 2 shows a side sectional view of the MEMS chip.

Referring now to FIGS. 1 and 2, FIG. 1 shows a top view of a microelectromechanical systems (MEMS) chip 20 in accordance with an embodiment, and FIG. 2 shows a side sectional view of MEMS chip 20. The top view of MEMS chip 20 shown in FIG. 1 is taken along section lines 1-1 of FIG. 2, and the side sectional view of MEMS chip 20 shown in FIG. 2 is taken along section lines 2-2 of FIG. 1. FIGS. 1-2 and subsequent FIGS. 3-16 are illustrated using various shading and/or hatching to distinguish the different elements of MEMS chip 20, as will be discussed below. These different elements within the structural layers may be produced utilizing current and upcoming micromachining techniques of depositing, patterning, etching, and so forth.

MEMS chip 20 is a MEMS device assembly that includes a MEMS die 22 and an integrated circuit die 24. MEMS die 22 has bondwire pads 26. Similarly, integrated circuit die 24 has bondwire pads 28. MEMS die 22 and integrated circuit die 24 are electrically interconnected via conductive interconnects 30 spanning between bondwire pads 26 and bondwire pads 28. MEMS die 22, integrated circuit die 24, bondwire pads 26, bondwire pads 28, and conductive interconnects 30 are overmolded with a molding compound 32. That is, molding compound 32 substantially encapsulates MEMS die 22, integrated circuit die 24, bondwire pads 26, bondwire pads 28, and conductive interconnects 30. However, MEMS die 22 is a MEMS package that includes a cap layer 34 overlying a MEMS device 36. Cap layer 34 prevents molding compound 32 from contacting the underlying MEMS device 36.

MEMS die 22 further includes a first substrate 38 having a front side 40 and a back side 42 separated from front side 40 by a substrate thickness 44. MEMS device 36 is formed on, or alternatively, in front side 40 of first substrate 38. A material portion of first substrate 38 is removed surrounding MEMS device 36 to form a cantilevered substrate platform 46 at which MEMS device 36 resides. Cantilevered substrate platform 46 includes an arm 48 extending from platform 46. A first end 50 of arm 48 is fixed to first substrate 38, and a second end 52 of arm 48 is fixed to substrate platform 46. Thus, once the material portion of first substrate 38 is removed, an opening 54 extends through substrate thickness 44 of first substrate 38 and partially surrounds cantilevered substrate platform 46, with first end 50 of arm 48 being the sole attachment point of cantilevered substrate platform 46 to the surrounding first substrate 38. In addition, conductive traces 55 may be formed on arm 48. Traces 55 electrically couple bondwire pads 26 with MEMS device 36 residing on cantilevered substrate platform 46. The terms "first" and "second" used herein do not refer to an ordering or prioritization of elements within a countable series of elements. Rather, the terms "first" and "second" are used to distinguish the particular elements for clarity of discussion.

In the illustrated embodiment, first substrate 38 includes an aperture 56 extending from back side 42 of first substrate 38 to an active region 58 of MEMS device 36. MEMS device 36 further includes a second substrate 60 attached to back side 42 of first substrate 38. A material portion of second substrate 60 is removed from second substrate 60 to form another cantilevered substrate platform 62, best seen in FIG. 10. Once the material portion of second substrate 60 is removed, an opening 64 extends through second substrate 60, and partially surrounds cantilevered substrate platform 62.

Second substrate 60 is attached to back side 42 of first substrate 38 so that cantilevered substrate platform 62 (FIG. 10) is vertically stacked with cantilevered substrate platform 46 of first substrate 38 to form a stacked cantilevered platform structure 66. In this configuration, platform 62 of second substrate 60 covers aperture 56 to form a sealed cavity 68 underlying active region 58 of MEMS device. Openings 54 and 64 in respective substrates 38 and 60 serve as a port so that active region 58 of MEMS device 36 is exposed to an environment 70 external to MEMS chip 20. In alternative embodiments, second substrate 60 may not be required (discussed below). In still other embodiments, MEMS devices may not require a port to environment 70. As such, substrate 60 may serve as a seal or cap (also discussed below).

MEMS device 36 may be configured to sense a pressure stimulus from environment 70 external to MEMS chip 20. Active region 58 is exposed to external environment 70 via aligned openings 54 and 64 extending through respective substrates 38 and 60. In an exemplary embodiment, MEMS device 36 may be a piezoresistive type pressure sensor. Piezoresistive pressure sensors sense external pressure by means of a piezoresistance effect of a silicon diaphragm as the pressure detecting device. For example, piezoresistive materials (not shown) may be deposited on, diffused into, or otherwise formed on or into front side 40 of first substrate 38 at active region 58, which serves as a movable diaphragm. The piezoresistive elements are typically realized as diffused resistors, and these diffusion resistors are typically connected into a bridge circuit. The pressure signal is taken out from the bridge circuit in accordance with changes in the resistance values of the diffusion resistors which are caused by displacement of the diaphragm, e.g. active region 58.

Although in certain embodiments, MEMS device 36 may be a piezoresistive pressure sensor and active region 58 may be a movable diaphragm, it should be understood that MEMS device 36 represents a variety of one or more MEMS components of MEMS chip 20, such as microswitches and/or microsensors. Microsensors include, for example, pressure sensors, accelerometers, gyroscopes, microphones, micro fluidic devices, and so forth. Accordingly, active region 58 represents any sensing, or movable, element of a particular MEMS component. Integrated circuit die 24 represents the central unit, e.g., a microprocessor, that processes data from MEMS device 36. Thus, integrated circuit die 24 provides "intelligence" built into MEMS chip 20. Although MEMS chip 20 is shown as including only one MEMS device 36 and one integrated circuit die 24, it should be understood that MEMS chip 20 can include any number of MEMS dice 22 and integrated circuit dice 24 in accordance with particular design requirements for MEMS chip 20.

In general, MEMS die 22 is fabricated in accordance with wafer-level packaging methodology that achieves improved package stress isolation of MEMS device 36.

MEMS die 22 and integrated circuit die 24 are interconnected via conductive interconnects 30, and the resulting structure is encapsulated in molding compound 32 as discussed in the ensuing methodology.

Figure 3:
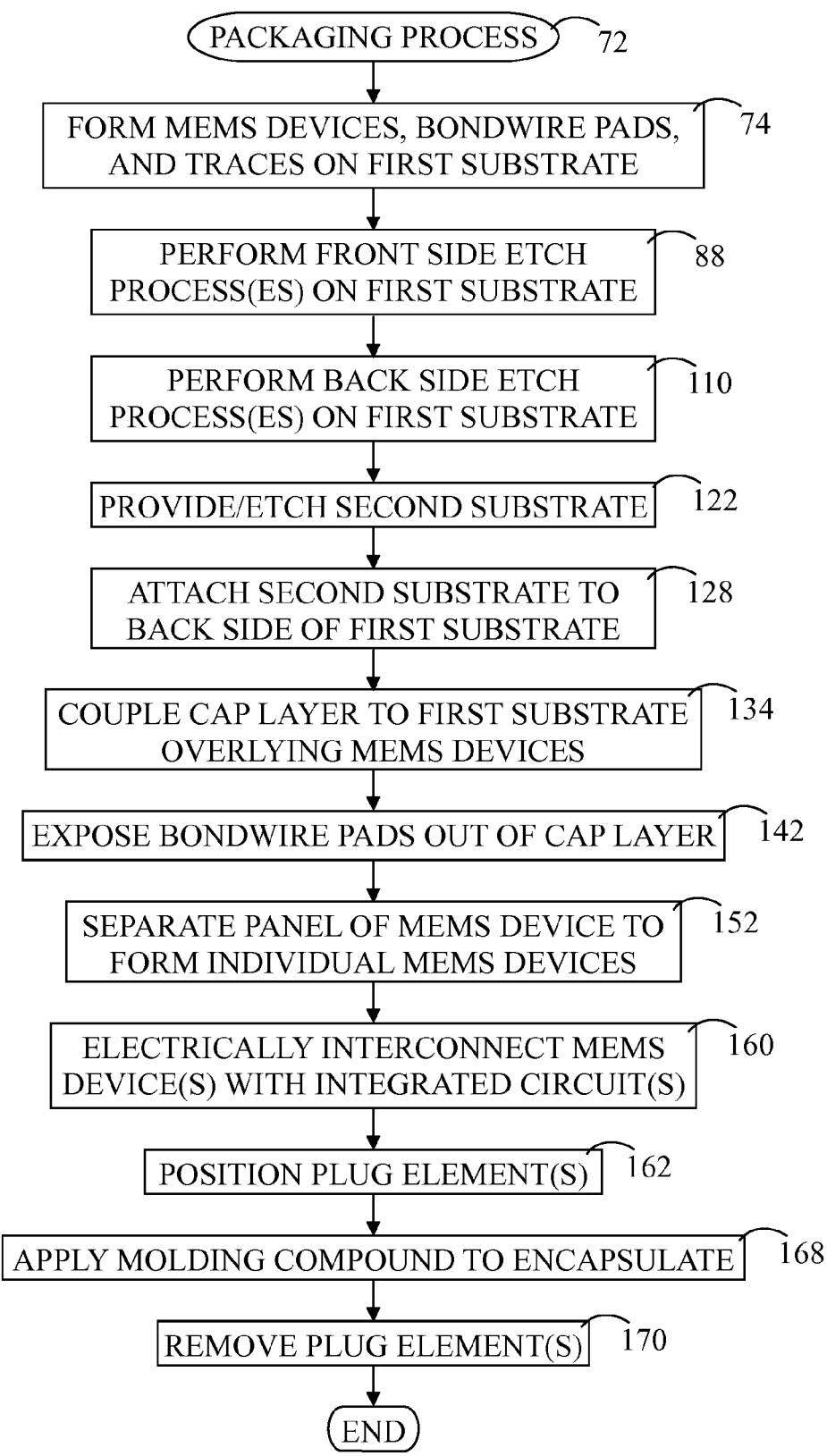
FIG. 3 shows a flowchart of a packaging process for producing and packaging the MEMS chip of FIGS. 1 and 2 in accordance with another embodiment.

FIG. 3 shows a flowchart of a packaging process 72 for producing and packaging MEMS chip 20 (FIGS. 1 and 2) in accordance with another embodiment. Process 72 implements known and developing MEMS micromachining technologies to cost effectively yield MEMS chip 20 that includes at least one MEMS die 22 having improved package stress isolation. Although a single process is shown in which MEMS chip 20 is produced and packaged, it should be understood that multiple entities may execute certain operations of process 72. By way of example, one manufacturer may produce MEMS die 22 and another manufacturer may subsequently package MEMS die 22 to yield MEMS chip 20. Process 72 is described below in connection with the fabrication and packaging of only a few MEMS dice 22 and a few MEMS chips 20. However, it should be understood by those skilled in the art that the following process allows for concurrent wafer-level manufacturing of a plurality of MEMS dice 22. These individual MEMS dice 22 can subsequently be packaged and integrated into an end application that includes integrated circuit die 24.

MEMS chip packaging process 72 begins with a task 74. At task 74, fabrication processes related to the formation of MEMS devices 36, bondwire pads 26, and traces 55 are performed.

Figure 4:
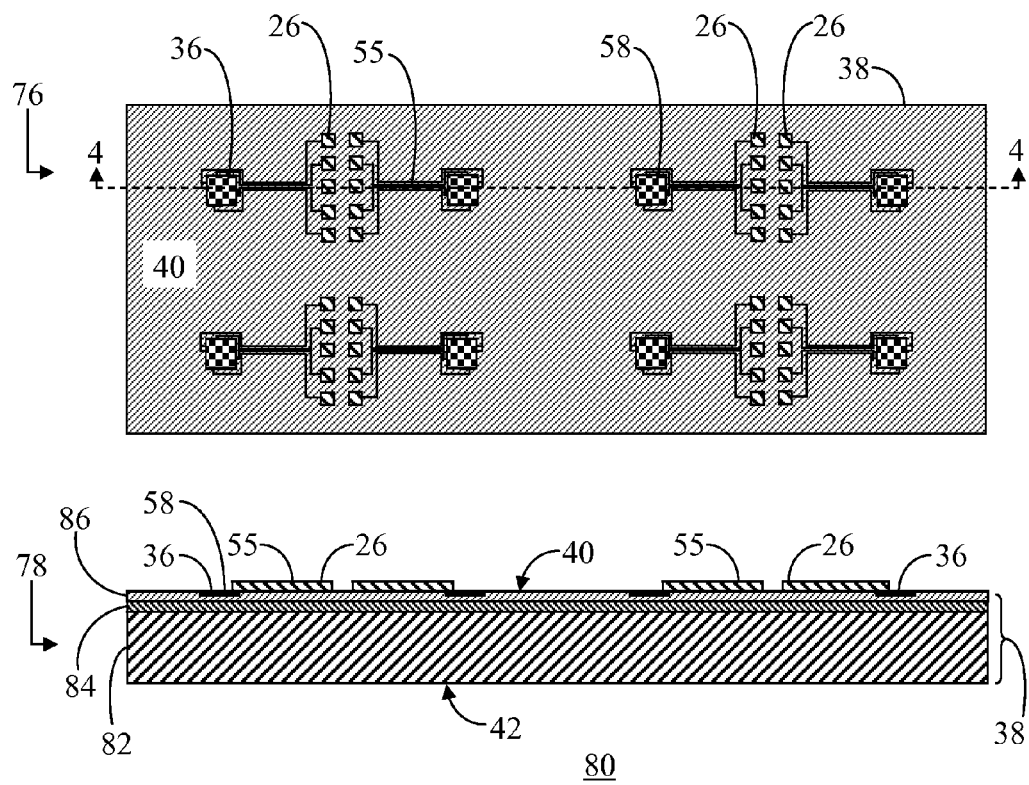
FIG. 4 shows a top view and a side sectional view of a partial MEMS wafer at an initial stage of processing.

Referring to FIG. 4 in connection with task 74, FIG. 4 shows a top view 76 and a side sectional view 78 of a partial wafer at an initial stage of processing 80 to produce MEMS chip 20 (FIG. 1). Side sectional view 78 is taken along section lines 4-4 of top view 76. In an embodiment, fabrication processes may implement silicon on insulator technology (SOI). SOI technology refers to the use of a silicon-insulator-silicon substrate in lieu of conventional silicon substrates. SOI-based devices differ from conventional silicon-built devices in that the silicon junction is above an electrical insulator, typically silicon dioxide. In MEMS devices, SOI wafers may be used to fabricate piezoresistive pressure sensors because the thin silicon junction, or layer, can be used to form a diaphragm of the pressure sensor that is able to bow when pressure is applied. For other MEMS sensor configurations, the thin silicon junction may be used to form the active (moving) part of the sensor.

As shown, first substrate 38 is an SOI-based wafer having a silicon (e.g., single crystal silicon) base layer 82, a silicon dioxide insulating layer 84, and a silicon (e.g., polysilicon) top layer 86. Fabrication processes may entail the diffusion, or implantation, of piezoresistive materials (not shown) into front side 40 of first substrate 38, and in particular into silicon top layer 86, to form active regions 58 of MEMS devices 36 having diffusion resistors. Next, metal deposition, patterning, and etching may be performed to form bondwire pads 26 and traces 55. Traces 55 may at least partially overly the diffusion resistors to form suitable electrical connections. Other fabrication activities may be performed per convention that are not discussed or illustrated herein for clarity of description.

With reference back to FIG. 3, packaging process continues with a task 88. At task 88, one or more front side etch processes are performed on first substrate 38.

Figure 5:
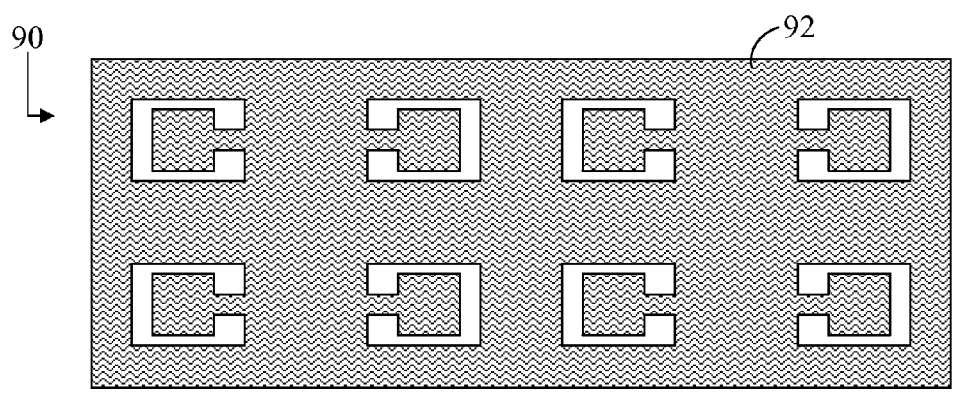
FIG. 5 shows a top view of a mask used at a subsequent stage of processing.
Figure 6:
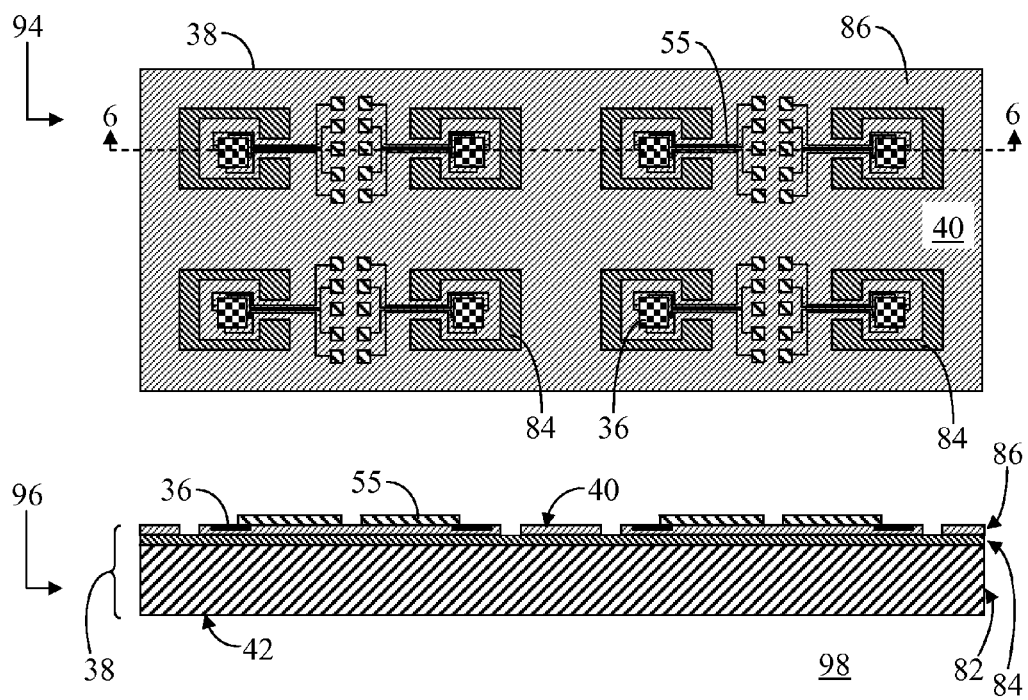
FIG. 6 shows a top view and a side sectional view of the structure of FIG. 4 at a subsequent stage of processing.
Figure 7:
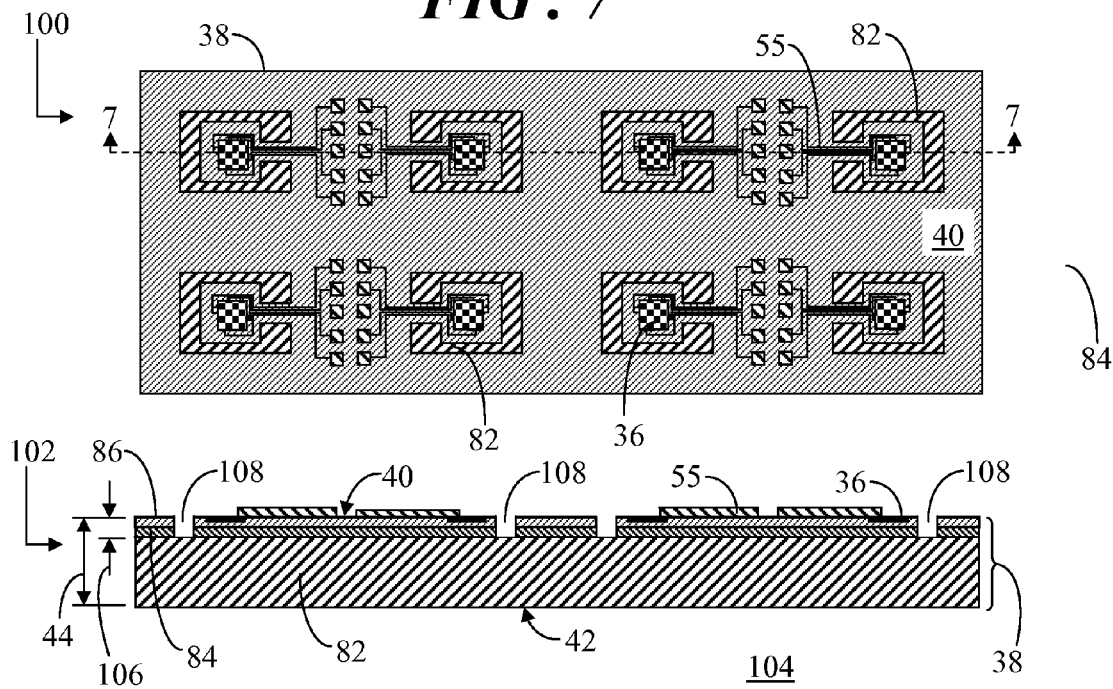
FIG. 7 shows a top view and a side sectional view of the structure of FIG. 6 at a subsequent stage of processing.

Referring to FIGS. 5-7 in connection with task 88, FIG. 5 shows a top view 90 of a mask 92 used in connection with a subsequent stage of processing represented by task 88. FIG. 6 shows a top view 94 and a side sectional view 96 of structure of FIG. 4 at a subsequent stage of processing 98, and FIG. 7 shows a top view 100 and a side sectional view 102 of the structure of FIG. 6 at a subsequent stage of processing 104. Side sectional view 96 is taken along section lines 6-6 of top view 94 in FIG. 6. Similarly, side sectional view 102 is taken along section lines 7-7 of top view 100 in FIG. 7.

Task 88 relates to one or more etch processes performed from front side 40 of first substrate 38 toward back side 42 of first substrate 38. Mask 92 is used to cover or otherwise protect those regions of front side 40 that are not to be etched. As such, mask 92 provides a pattern for forming openings 54 (FIG. 1) through first substrate 38 and for producing cantilevered substrate platform 46 (FIG. 1). Mask 92 is shown as a separate element for illustrative purposes. However, in an embodiment, mask 92 may be formed by depositing a resist material on front side 40 and appropriately patterning the resist material to produce the pattern of mask 92 on front side 40. FIG. 6 represents the outcome of a first front side removal, i.e., etching, process that removes a material portion of silicon top layer 86 so that the underlying silicon dioxide insulating layer 84 is exposed. FIG. 7 represents the outcome of a second front side removal, i.e., etching, process that removes a material portion of silicon dioxide insulating layer 84 so that the underlying silicon base layer 82 is exposed.

The first and second front side removal processes may be performed using any of a number of known and upcoming etching processes, such as a Deep Reactive Ion Etch (DRIE) technique, a Potassium Hydroxide (KOH) etch technique, or any suitable techniques, so that a thickness 106 of a section 108 removed of the total material portion of first substrate 38 to be removed is less than thickness 44 of first substrate 38.

With reference back to FIG. 3, following task 88, packaging process 72 continues with a task 110. At task 110, one or more back side etch processes are performed on first substrate 38.

Figure 8:
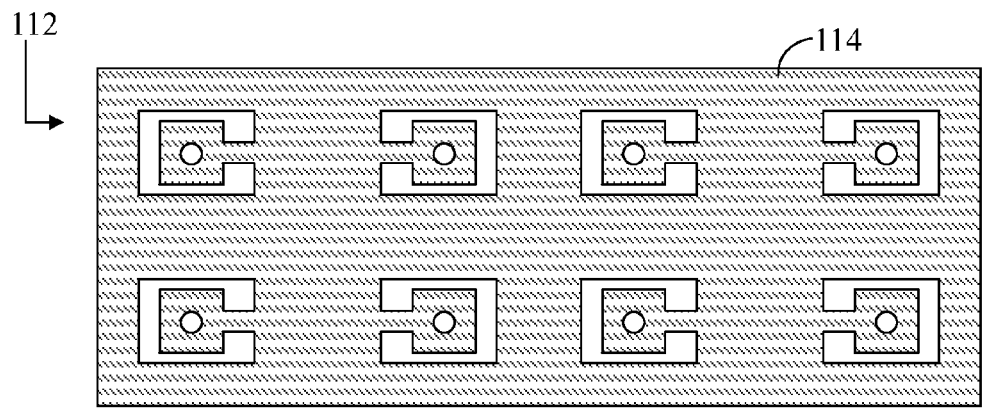
FIG. 8 shows a top view of a mask used at a subsequent stage of processing.
Figure 9:
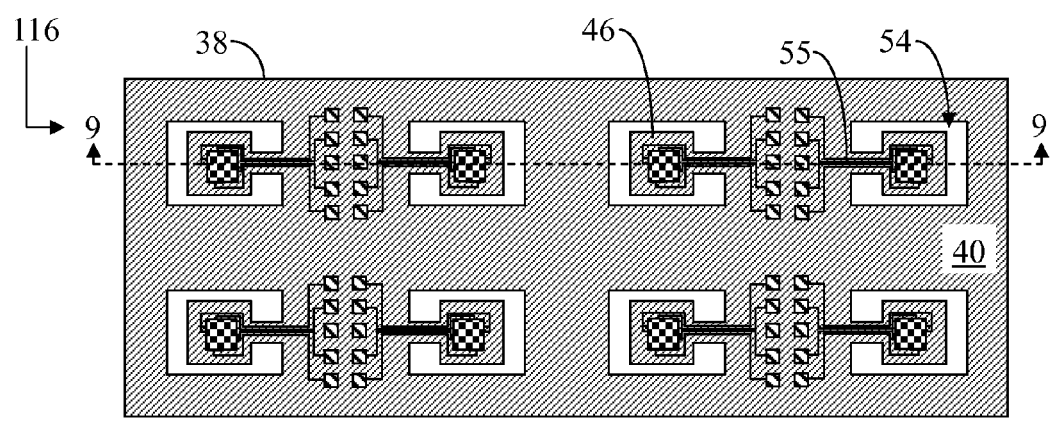
FIG. 9 shows a top view and a side sectional view of the structure of FIG. 7 at a subsequent stage of processing.
Figure 9:
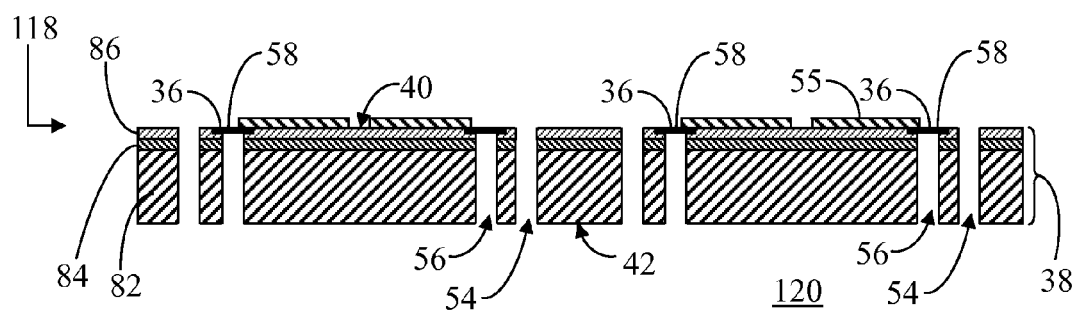

Referring to FIGS. 8 and 9 in connection with task 110, FIG. 8 shows a top view 112 of a mask 114 used at a subsequent stage of processing represented by task 110, and FIG. 9 shows a top view 116 and a side sectional view 118 of the structure of FIG. 7 at a subsequent stage of processing 120. Side sectional view 118 is taken along section lines 9-9 of top view 116 in FIG. 9.

Task 110 relates to one or more etch processes performed from back side 42 of first substrate 38 toward front side 40 of first substrate 38. Mask 114 is used to cover or otherwise protect those regions of back side 42 that are not to be removed. As such, mask 114 provides a pattern for forming openings 54 (FIG. 1) through first substrate 38 so as to produce cantilevered substrate platform 46 (FIG. 1). In addition, mask 114 provides a pattern for forming apertures 56 through substrate 38 underlying active regions 58 of MEMS devices 36.

FIG. 9 represents the outcome of a back side removal, i.e., etching, process performed at task 110 that removes the remainder of the material portion of first substrate 38 to form openings 54 extending through an entirety of first substrate 38 and thereby produce cantilevered substrate platform 46. In addition, the back side removal processes concurrently removes another material portion of first substrate 38 to produce apertures 56 extending through first substrate 38 to active regions 58. The back side removal processes may be performed using any of a number of known and upcoming etching processes, such as a Deep Reactive Ion Etch (DRIE) technique, a Potassium Hydroxide (KOH) etch technique, or any other suitable technique. It should be noted that some MEMS device embodiments may not call for apertures 56. Accordingly, openings 54 in first substrate 38 to produce cantilevered substrate platform 46 may be formed by implementing only a front side etch process or, alternatively, a back side etch process.

With reference back to FIG. 3, following task 110, packaging process 72 continues with a task 122. At task 122, second substrate 60 is provided and/or etched.

Figure 10:
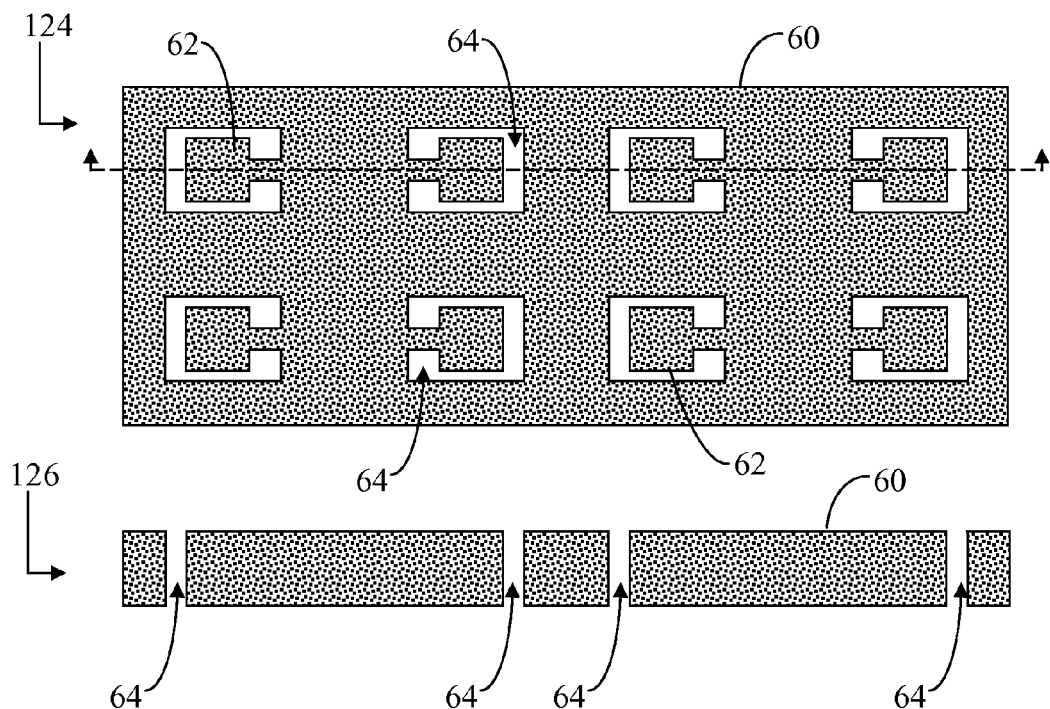
FIG. 10 shows a top view and a side sectional view of a second substrate used to form the MEMS chip of FIG. 1.

Referring now to FIG. 10 in connection with task 122, FIG. 10 shows a top view 124 and a side sectional view 126 of second substrate 60 used to form MEMS chip 20 (FIG. 1). Side sectional view 126 is taken along section lines 10-10 of top view 124 in FIG. 10. Second substrate 60 may be a wafer supplied by an outside provider with openings 64 already formed therein to produce cantilevered substrate platforms 62. Alternatively, second substrate 60 may be a wafer supplied by an outside provider that is subsequently etched or otherwise processed to form openings 64 at least partially surrounding cantilevered substrate platforms 62.

With reference back to FIG. 3, following task 122, packaging process 72 continues with a task 128. At task 128, second substrate 60 is attached to back side 42 of first substrate 38.

Figure 11:
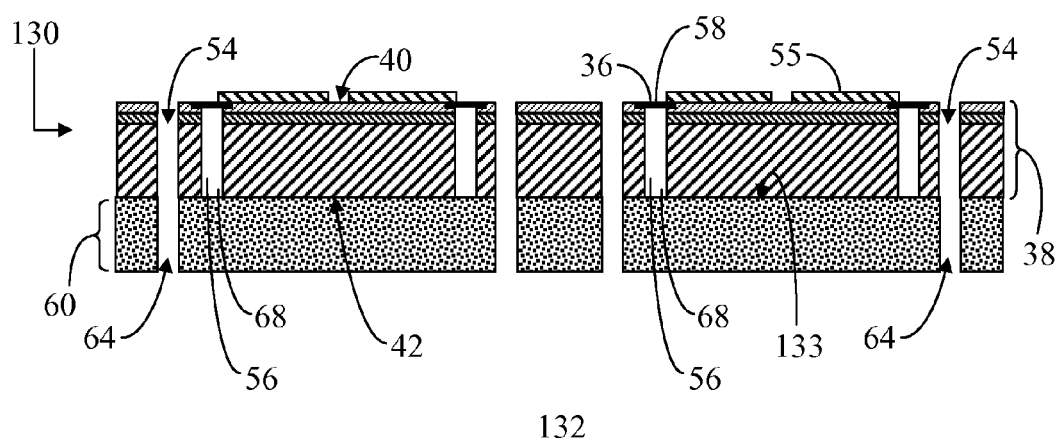
FIG. 11 shows a side view of the structure of FIG. 9 at a subsequent stage of processing.

Referring to FIG. 11 in connection with task 122, FIG. 11 shows a side sectional view 130 of the structure of FIG. 9 at a subsequent stage of processing 132. FIG. 11 represents the outcome of attaching task 128 of process 72.

As shown, a front side 133 of second substrate 60 has been attached to back side 42 of first substrate 38 such that openings 54 and 64 of first and second substrates 38 and 60, respectively, are aligned, and so that cantilevered substrate platforms 46 and 62 are vertically stacked to form stacked cantilevered platform structure 66 (FIG. 2). In this configuration, cantilevered substrate platforms 62 (FIG. 10) of second substrate 60 covers apertures 56 to yield sealed cavities 68. Second substrate 60 may be attached to first substrate 38 using any suitable attachment process and material known to those skilled in the art (e.g., glass frit bonding, silicon fusion bonding, metal eutectic bonding, anodic bonding, thermal compression bonding, and so forth). It should be noted that in those MEMS device embodiments that do not call for apertures 56 and sealed cavities 68, the inclusion of second substrate 60 in MEMS die 22 (FIG. 1) may not be required. Still other embodiments may call for a modified version of substrate 60.

With reference back to FIG. 3, following task 128, packaging process 72 continues with a task 134. At task 134, cap layer 34 is coupled to first substrate 38 overlying MEMS devices 36.

Figure 12:
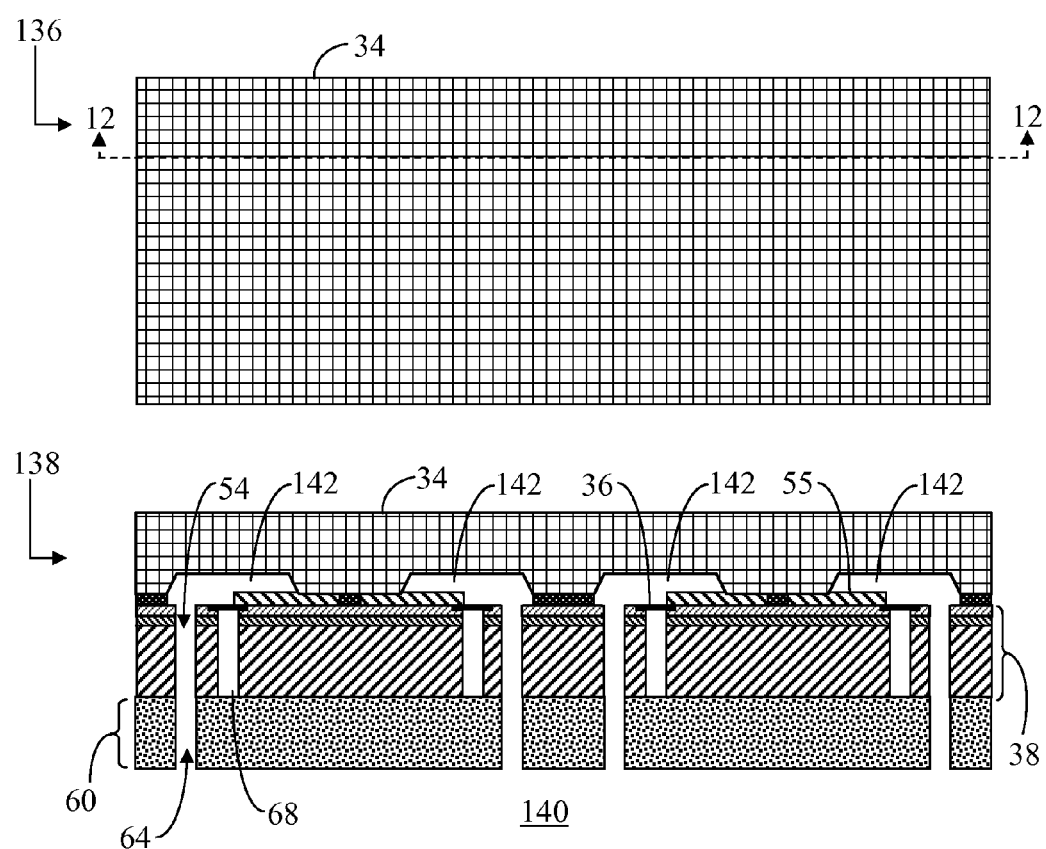
FIG. 12 shows a top view and a side sectional view of the structure of FIG. 11 at a subsequent stage of processing.

Referring to FIG. 12 in connection with task 134, FIG. 12 shows a top view 136 and a side sectional view 138 of the structure of FIG. 11 at a subsequent stage of processing 140. Side sectional view 138 is taken along section lines 12-12 of top view 136 in FIG. 12. In an embodiment, cap layer 34 may be a wafer structure that has been appropriately etched, machined, or otherwise processed to include cavities 142. Cap layer 34 provides protection for MEMS devices 36 during subsequent stages of processing and during operation, and cavities 142 provide suitable free space for MEMS devices 36 so that the inner walls of cap layer 34 do not come into contact with any moving parts of MEMS device 36. Although not shown, cap layer 34 may additionally include cavities over bondwire pads 26 (FIG. 1) so that inner walls of cap layer 34 do not come into contact with bondwire pads 26. The coupling of cap layer 34 to first substrate structure 38 may be accomplished using, for example, glass frit bonding, metal eutectic bonding, and the like.

With reference back to FIG. 3, following task 134, process 72 continues with a task 142. At task 142, bondwire pads 26 are exposed out of cap layer 34.

Figure 13:
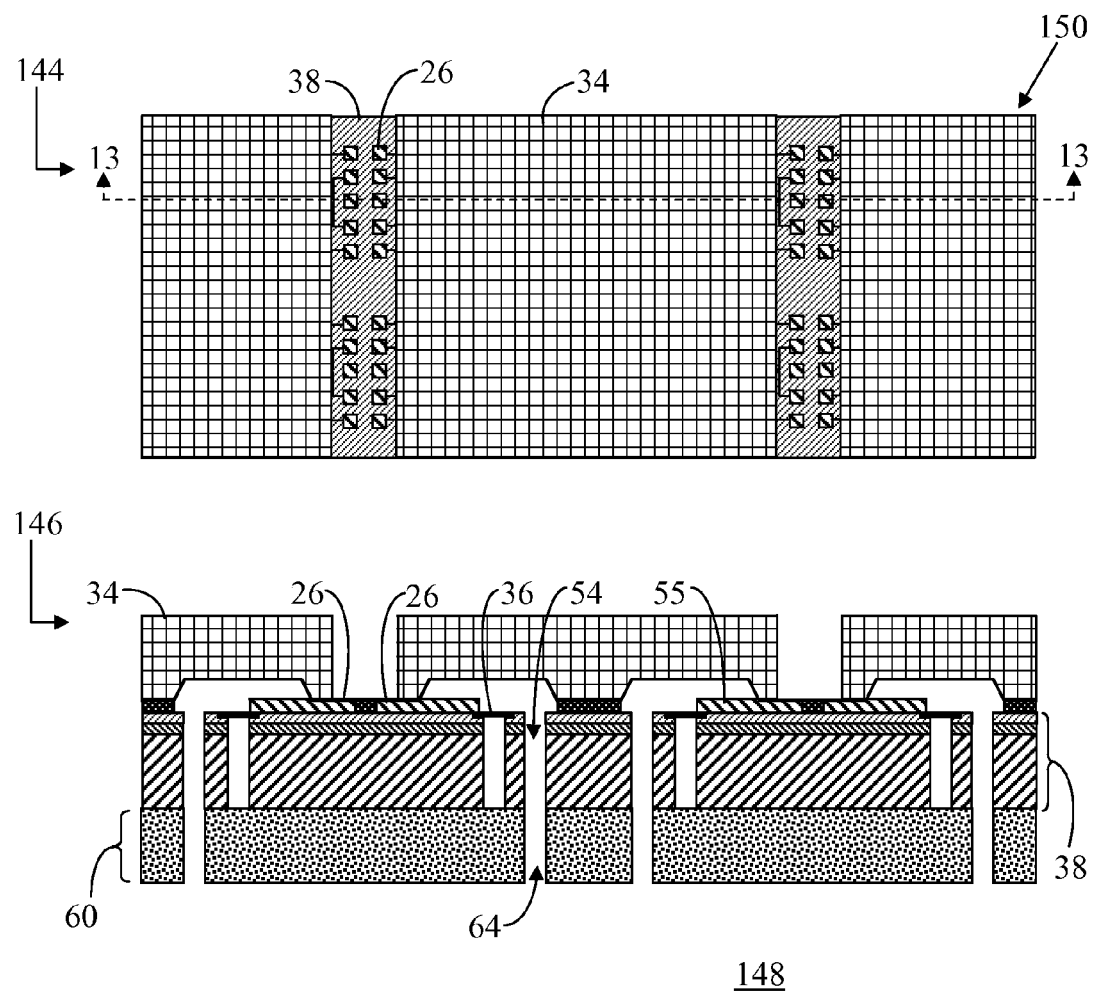
FIG. 13 shows a top view and a side sectional view of the structure of FIG. 12 at a subsequent stage of processing.

Referring to FIG. 13 in connection with task 142, FIG. 13 shows a top view 144 and a side sectional view 146 of the structure of FIG. 12 at a subsequent stage of processing 148. Side sectional view 146 is taken along section lines 13-13 of top view 144 in FIG. 13. In an embodiment, a portion of cap layer 34 is sawn, etched, or otherwise removed to reveal bondwire pads 26. Through execution of the aforementioned tasks, a panel 150 of MEMS dice 22, each including at least one MEMS device 36 is produced.

Now referring back to FIG. 3, following task 142, packaging process 72 continues with a task 152. At task 152, panel 150 of MEMS dice 22 is separated to form individual MEMS dice 22, each including at last one MEMS device 36.

Figure 14:
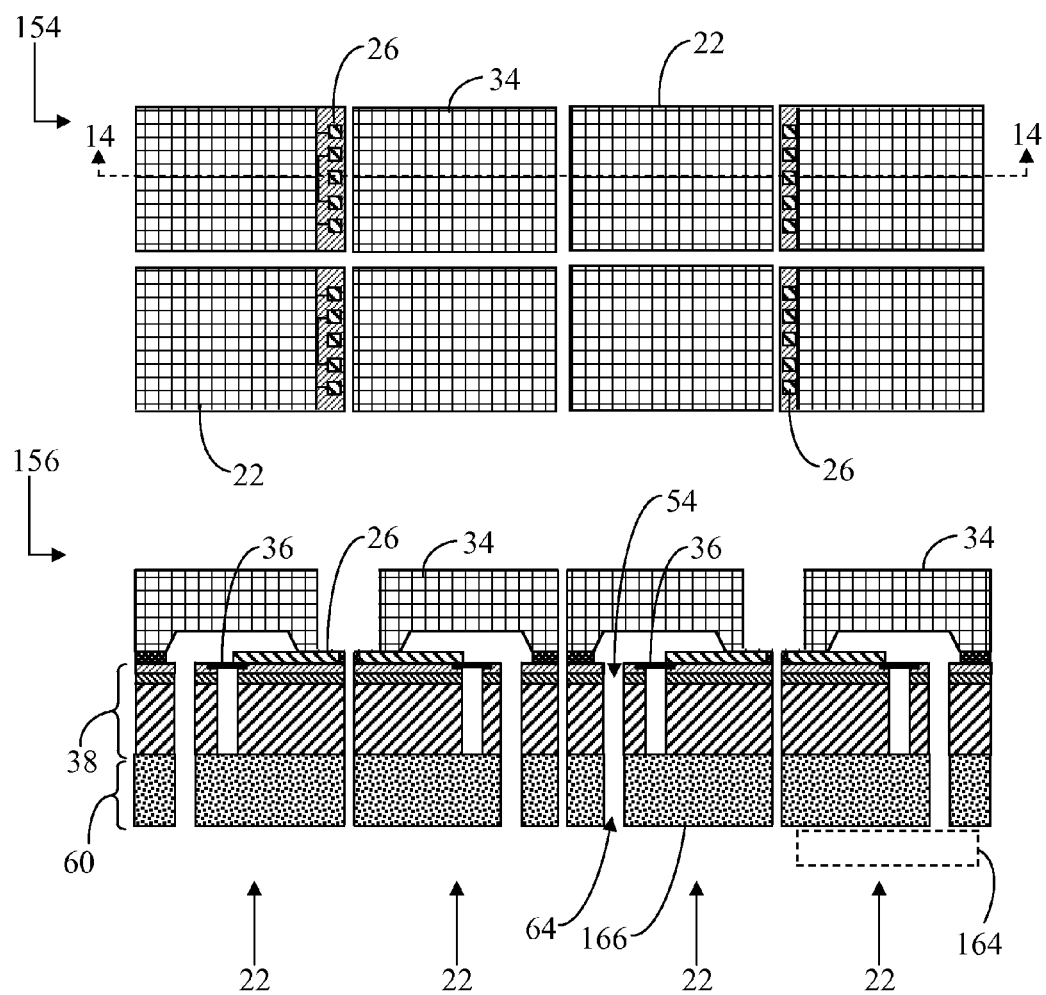
FIG. 14 shows a top view and a side sectional view of the structure of FIG. 13 at a subsequent stage of processing.

Referring to FIG. 14 in connection with task 152, FIG. 14 shows a top view 154 and a side sectional view 156 of the structure of FIG. 13 at a subsequent stage of processing 158. Side sectional view 156 is taken along section lines 14-14 of top view 154 in FIG. 14. FIG. 14 represents the outcome of a panel separation process performed at task 152. As shown, panel 150 (FIG. 13) has been sawn, diced, or otherwise separated to form individual MEMS dice 22, each of which includes at least one MEMS device 36 protected by cap layer 34.

With reference back to FIG. 3, packaging process 72 continues with a task 160. At task 160, each MEMS die 22 (FIG. 1) is electrically interconnected with its integrated circuit die 24 (FIG. 1) via conductive interconnects 30 (FIG. 1). For example, a wirebonding process may be performed to form external connections between bondwire pads 26 of MEMS die 22 and bondwire pads 28 of integrated circuit die 24 using conductive interconnects 30, as illustrated in FIG. 1.

Following task 160, a task 162 is performed. It will be recalled that MEMS chip 20 (FIG. 1) is encapsulated in molding compound 32. However, aligned openings 64 and 54 cannot be filled with or blocked by molding compound. Accordingly, at task 162 a plug element is positioned at a back side of second substrate 60 to block opening 64, and consequently opening 54. Referring briefly to FIG. 14, a plug element 164 is shown in ghost form against a back side 166 of second substrate 60 of one MEMS die 22. Plug element 164 may be tape, a portion of a lead frame, or any other element that blocks opening 64. It should be understood that plug element 164 is shown in FIG. 14 for illustrative purposes. In actual use, plug element 164 may be appropriately positioned to block opening 64 after bondwire pads 26 (FIG. 1) of MEMS die 22 have already been interconnected with bondwire pads 28 (FIG. 1) of integrated circuit die 24.

Following task 162, a task 168 is performed. At task 168, molding compound 32 is applied to MEMS die 22 with its attached integrated circuit die 24. Molding compound 32 substantially encapsulates MEMS die 22, integrated circuit die 24, bondwire pads 26 and 28, and conductive interconnects 30. However, cap layer 34 of MEMS die 22 overlying MEMS device 36 prevents molding compound 32 from direct contact with MEMS device 36. In addition, plug element 164 (FIG. 14) blocking opening 64 prevents the flow of molding compound 32 into opening 64.

In some prior art designs, MEMS devices are subjected to a silicon gel coating process, and then the MEMS dice and associated integrated circuit dice are subsequently overmolded with a molding compound. The gel coating stress-isolates the MEMS devices from the molding compound. In such a configuration, the electrical interconnects between the MEMS dice and integrated circuit dice may thus pass through both of the silicon gel coating and a molding compound. Unfortunately, silicon gel coating adds to the material cost and packaging complexity of the MEMS chips. Moreover, the electrical interconnects are subject to stress and breakage at the interface between the gel coating and the molding compound. This problem is at least partially addressed in prior art designs by using larger diameter wires for the electrical interconnects. Of course, larger diameter wires can be more costly and can result in a larger overall MEMS die. The implementation of cap layer 34 and molding compound 32 eliminate the need for silicon gel coating in some embodiments and the commensurate need in some embodiments for the larger diameter wires, thereby simplifying fabrication and reducing material and fabrication costs.

Following encapsulation at task 168, a task 170 is performed. At task 170, plug element 164 is removed to yield MEMS chip 20 (FIG. 1). Packaging process 72 exits following task 170. MEMS chip 20 resulting from packaging process 72 therefore includes one or more MEMS devices 36 suspended on cantilevered substrate platform 46. Accordingly, MEMS devices 36 are less sensitive to variations in package stress. Additionally, the elements of MEMS chip 20 are packaged in an inexpensive overmolded package, i.e., encapsulated in molding compound 32, to provide environmental protection. However, the coupling of cap layer 34 over MEMS devices 36 protects them from particulate contamination, such as residue from panel separation. Furthermore, cap layer 34 protects the fragile movable parts of MEMS devices 36 so that molding compound 32 cannot come into contact with MEMS devices 36.

Figure 15:
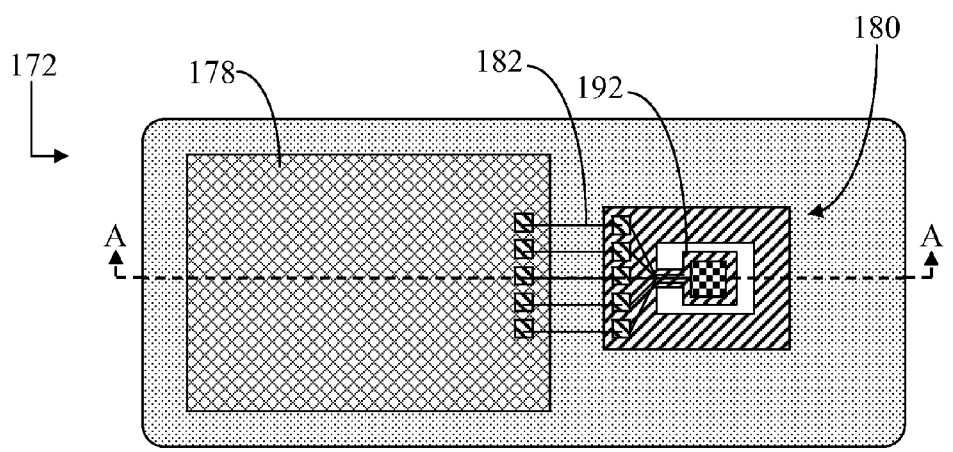
FIG. 15 shows a top view and a side sectional view of a MEMS chip in accordance with another embodiment.
Figure 15:
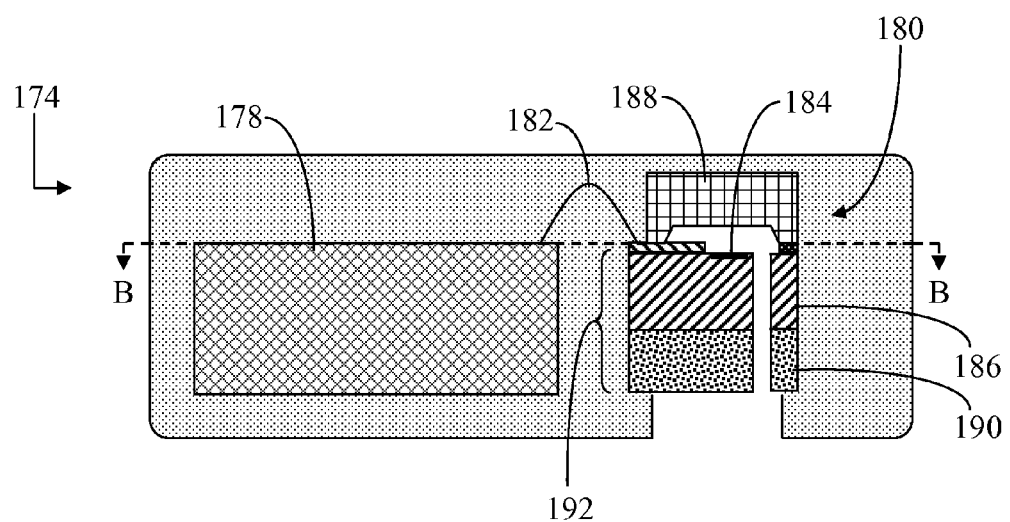

FIG. 15 shows a top view 172 and a side sectional view 174 of a MEMS chip 176 in accordance with another embodiment. Top view 172 of MEMS chip 176 is taken along section lines B-B of side sectional view 174. Likewise, side sectional view 174 is taken along section lines A-A of top view 172. Packaging process 72 may be adapted to produce MEMS chip 176. MEMS chip 176 includes an integrated circuit die 178 and a MEMS die 180 electrically coupled via interconnects 182. MEMS die 180 includes a MEMS device 184 surface micromachined on a first substrate 186 and protected by a cap layer 188. In this exemplary embodiment, first substrate 186 is not an SOI starting material, but instead may be a conventional silicon wafer upon which polysilicon and metal layers are surface micromachined to create MEMS device 184, the details of which are not shown. MEMS die 180 may further include a second substrate 190 attached to first substrate 186. First and second substrates 186 and 190, respectively, are formed in accordance with packaging process 72 (FIG. 3) to yield a stacked cantilevered platform structure 192 upon which MEMS devices 184 reside. Of course, in other embodiments, second substrate 190 may not be required. Regardless, this alternative embodiment achieves the benefits of improved package stress isolation and an inexpensive overmolded package.

Figure 16:
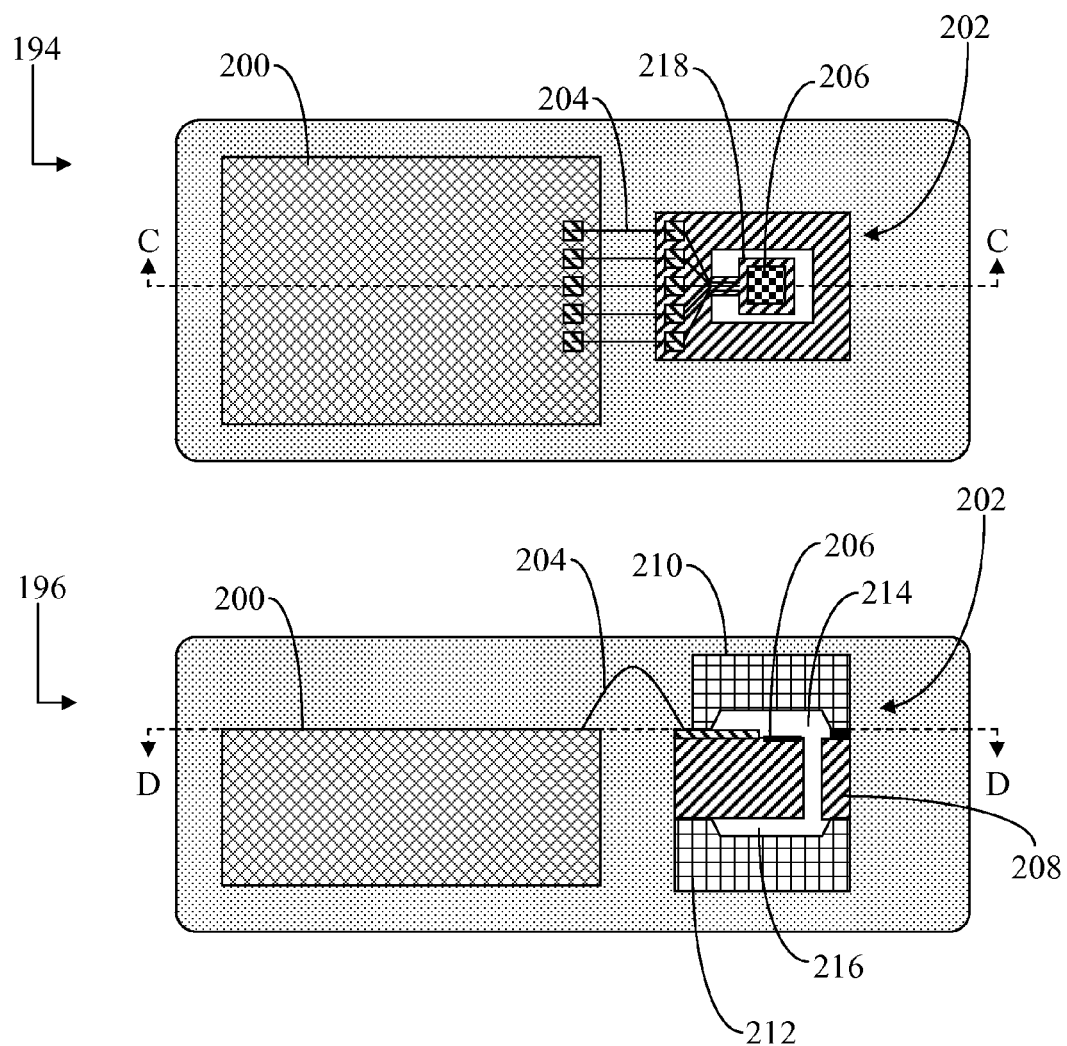
FIG. 16 shows a top view and a side sectional view of a MEMS chip in accordance with yet another embodiment.

FIG. 16 shows a top view 194 and a side sectional view 196 of a MEMS chip 198 in accordance with yet another embodiment. Top view 194 of MEMS chip 198 is taken along section lines D-D of side sectional view 196. Likewise, side sectional view 196 is taken along section lines C-C of top view 194. Packaging process 72 may also be adapted to produce MEMS chip 198. MEMS chip 198 includes an integrated circuit die 200 and a MEMS die 202 electrically coupled via interconnects 204. MEMS die 202 includes a MEMS device 206 surface micromachined on a substrate 208 and protected by a first cap layer 210 and second cap layer 212 to form a hermetically sealed package in which MEMS device 206 is housed. In an exemplary embodiment, MEMS device 206 may be an inertial sensor, such as an accelerometer. Such sensors may not require a port for exposure to an external environment. However, such sensors may call for a hermetically enclosed cavity design (in this embodiment using cap layers 210 and 212), to protect MEMS device 206 from particle contamination, moisture, and so forth. Cap layers 210 and 212 provide cavities 214 and 216, respectively, to achieve free space so that mechanical action of MEMS device 206 is allowed.

In this exemplary embodiment, substrate 208 may not be an SOI starting material depending upon the process flow, but instead may be a conventional silicon wafer upon which polysilicon and metal layers are surface micromachined to create MEMS device 206, the details of which are not shown. Substrate 208 is processed to form a cantilevered substrate platform 218 upon which MEMS device 206 resides. However, second cap layer 212 functions as a second substrate attached to substrate 208, but is fabricated to include cavities 216 underlying cantilevered substrate platform 218 of substrate 208. It is subsequently attached to substrate 208 in accordance with packaging process 72 (FIG. 3). Like the previously described embodiments, this alternative embodiment achieves the benefits of improved package stress isolation and an inexpensive overmolded package.

Embodiments described herein comprise compact MEMS device assemblies, i.e., MEMS chips, that include one or more integrated circuit dice and one or more MEMS dice. A MEMS die includes a cantilevered platform structure upon which a MEMS device resides. This cantilevered platform structure achieves the benefit of improved package stress isolation. Packaging methodology entails forming the cantilevered platform structures in a substrate, capping the MEMS devices in a cap layer, wirebonding the MEMS dice with associated integrated circuit dice, and subsequently encapsulating the structure in a molding compound to form an overmolded package, e.g., MEMS chip. This methodology can be adapted for packaging a variety of MEMS device assemblies. Accordingly, the MEMS device assemblies and packaging methodology achieve the advantages of good device performance, small device size, inexpensive overmolded packaging, and adaptation to a variety of MEMS packaging needs.

What is claimed is:

1. A method of making a microelectromechanical systems (MEMS) device comprising:
   forming said MEMS device on a substrate, said substrate including a front side and a back side separated from said front side by a thickness of said substrate, said MEMS device being formed on said front side;
   removing a portion of said substrate partially surrounding said MEMS device to form a cantilevered substrate platform at which said MEMS device resides, said removing operation including removing at least a section of said portion of said substrate from said front side toward said back side, said at least a section of said portion having a section thickness that is less than said thickness of said substrate;
   removing a remainder of said portion of said substrate from said back side toward said front side; and
   coupling a cap layer overlying said MEMS device.

2. A method as claimed in claim 1 wherein said removing operation comprises producing said cantilevered substrate platform having an arm extending from said platform, a first end of said arm being fixed to said substrate, and a second end of said arm being fixed to said cantilevered substrate platform, wherein said arm is a sole attachment point of said platform to said substrate.

3. A method of making a microelectromechanical systems (MEMS) device comprising:
   forming said MEMS device on a substrate, said substrate including a front side and a back side separated from said front side by a thickness of said substrate, said MEMS device being formed on said front side, and said MEMS device having an active region;
   removing a first portion of said substrate partially surrounding said MEMS device to form a cantilevered substrate platform at which said MEMS device resides, said removing operation including removing a second portion of said substrate underlying said active region to form an aperture extending through said substrate to said active region, wherein said removing operation comprises:
      performing a first removal process from said front side toward said back side to remove a section of said first portion of said substrate, said section having a section thickness that is less than said thickness of said substrate; and
      performing a second removal process from said back side toward said front side to remove a remainder of said first portion to form said cantilevered substrate platform and to concurrently remove said second portion to form said aperture; and
   coupling a cap layer overlying said MEMS device.

4. A method of making a microelectromechanical systems (MEMS) device comprising:
   forming said MEMS device on a first front side of a first substrate;
   removing a first portion of said substrate partially surrounding said MEMS device to form a cantilevered substrate platform at which said MEMS device resides, said removing said first portion comprising:
      performing a first removal process from said first front side of said first substrate toward said first back side of said first substrate to remove a section of said first portion, said section having a section thickness that is less than a thickness of said first substrate; and
      performing a second removal process from said first back side of said first substrate toward said first front side of said first substrate to remove a remainder of said first portion and to concurrently remove a third portion of said first substrate underlying said active region to form an aperture extending through said first substrate;
   providing a second substrate;
   removing a second portion of said second substrate to form a second cantilevered substrate platform;
   following said second removal process, attaching a second front side of said second substrate to a first back side of said first substrate so that said second cantilevered substrate platform is vertically stacked with said cantilevered substrate platform to form a stacked cantilevered platform structure, wherein said second substrate covers said aperture to form a sealed cavity underlying said active region of said MEMS device; and
   coupling a cap layer overlying said MEMS device.

5. A method of making a microelectromechanical systems (MEMS) device comprising:
   forming said MEMS device on a first front side of a first substrate;

removing a first portion of said substrate partially surrounding said MEMS device to form a cantilevered substrate platform at which said MEMS device resides; and
providing a second substrate;
removing a second portion of said second substrate to form a second cantilevered substrate platform; and
attaching a second front side of said second substrate to a first back side of said first substrate so that said second cantilevered substrate platform is vertically stacked with said cantilevered substrate platform to form a stacked cantilevered platform structure; and
coupling a cap layer overlying said MEMS device, wherein said removing said first and second portions yields an opening extending through said first and second substrates partially surrounding said stacked cantilevered platform structure, and said method further comprises:
  positioning a plug member at a second back side of said second substrate to block said opening;
  applying a molding compound to substantially encapsulate said MEMS device and said coupled cap layer, wherein said applying operation is performed following said positioning operation; and
  following said applying operation, removing said plug member to expose at least a portion of said opening.

6. A method of making a microelectromechanical systems (MEMS) device comprising:
  forming said MEMS device and bondwire pads on a substrate, said bondwire pads being electrically coupled with said MEMS device via traces;
  removing a portion of said substrate partially surrounding said MEMS device to form a cantilevered substrate platform at which said MEMS device resides;
  coupling a cap layer overlying said MEMS device;
  exposing said bondwire pads of said MEMS device out of said cap layer;
  electrically interconnecting said bondwire pads with an integrated circuit die via conductive interconnects; and
  applying a molding compound to substantially encapsulate said MEMS device and said coupled cap layer, said cap layer preventing said molding compound from contacting said MEMS device, and said applying operation concurrently encapsulating said integrated circuit die, said conductive interconnects, said bondwire pads, said MEMS device, and said cap layer with said molding compound.

7. A method as claimed in claim 6 wherein:
  said forming operation forms multiple MEMS devices and bondwire pads on said substrate to form a panel of MEMS devices, wherein a distinct set of said bondwire pads is electrically coupled with one each of said multiple MEMS devices;
  said removing operation removes said portion of said substrate surrounding said MEMS devices to form multiple cantilevered substrate platforms, at least one of said MEMS devices residing upon one each of said cantilevered substrate platforms;
  said cap layer overlies said multiple MEMS devices;
  said exposing operation exposes said bondwire pads for said each of said multiple MEMS devices; and
  said method further comprises separating said multiple MEMS devices of said panel to form individual MEMS devices, said MEMS device being one of said multiple MEMS devices.

8. An assembly comprising:
  a substrate having a cantilevered substrate platform formed therein, said cantilevered substrate platform including an arm extending from said platform, wherein a first end of said arm is fixed to said substrate, and a second end of said arm is fixed to said cantilevered substrate platform, said arm being a sole attachment point of said platform to said substrate;
  a microelectromechanical (MEMS) device residing on said cantilevered substrate platform, said MEMS device including bondwire pads formed on said substrate and traces formed on said arm, said traces electrically coupling said bondwire pads with said MEMS device;
  an integrated circuit die interconnected with said bondwire pads via conductive interconnects;
  a cap layer overlying said MEMS device; and
  a molding compound substantially encapsulating said integrated circuit die, said conductive interconnects, said bondwire pads, said MEMS device, and said cap layer, wherein said cap layer prevents said molding compound from contacting said MEMS device.

9. An assembly as claimed in claim 8 wherein said substrate is a first substrate, said MEMS device is formed on a front side of said first substrate, and said assembly further comprises a second substrate attached to a back side of said first substrate, said second substrate including a second cantilevered substrate platform that is vertically stacked with said cantilevered substrate platform to form a stacked cantilevered platform structure.

10. An assembly as claimed in claim 9 wherein:
  said MEMS device includes an active region;
  said first substrate includes an aperture underlying said active region and extending through said first substrate to said active region; and
  said second substrate is attached to said first substrate such that said second cantilevered substrate platform covers said aperture to form a sealed cavity underlying said active region of said MEMS device.

11. A method of packaging a microelectromechanical systems (MEMS) assembly, said MEMS assembly including a MEMS device formed in a cantilevered substrate platform and a cap layer overlying said MEMS device, said cantilevered substrate platform having an arm extending from said platform, a first end of said arm being fixed to said substrate, a second end of said arm being fixed to said cantilevered substrate platform, and said arm being a sole attachment point of said platform to said substrate, bondwire pads electrically coupled with said MEMS device and exposed out of said cap layer, and said method comprising:
  electrically interconnecting said bondwire pads with an integrated circuit die via conductive interconnects; and
  following said electrically interconnecting operation, applying a molding compound to substantially encapsulate said integrated circuit die, said conductive interconnects, and said MEMS assembly, said cap layer preventing said molding compound from contacting said MEMS device.

* * * * *